(12) United States Patent  
Danneels

(10) Patent No.: US 9,136,868 B1
(45) Date of Patent: Sep. 15, 2015

(54) METHODS AND APPARATUS FOR AN IMPROVED ANALOG TO DIGITAL CONVERTER

(71) Applicant: Nokia Corporation, Espoo (FI)

(72) Inventor: Hans Danneels, El Cerrito, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/466,300

(22) Filed: Aug. 22, 2014

(51) Int. Cl.
| | |
|---|---|
| *H03M 1/12* | (2006.01) |
| *H03M 3/00* | (2006.01) |
| *H03M 1/36* | (2006.01) |
| *H03M 1/06* | (2006.01) |
| *H03M 1/00* | (2006.01) |

(52) U.S. Cl.
CPC .............. *H03M 3/46* (2013.01); *H03M 1/1265* (2013.01); *H03M 1/00* (2013.01); *H03M 1/0695* (2013.01); *H03M 1/12* (2013.01); *H03M 1/365* (2013.01)

(58) Field of Classification Search
CPC ....... H03M 1/12; H03M 1/00; H03M 1/0695; H03M 1/365
USPC .......................... 341/155, 162, 161, 156, 159
See application file for complete search history.

(56) References Cited

U.S. PATENT DOCUMENTS

| | | | |
|---|---|---|---|
| 6,714,152 B1 * | 3/2004 | Chou | 341/162 |
| 7,432,841 B1 | 10/2008 | Kinyua | 341/143 |

OTHER PUBLICATIONS

Chiu, Y. et al.; "A 14-b 12-MS/s CMOS Pipeline ADC With Over 100-dB SFDR"; IEEE Journal of Solid-State Circuits, vol. 39, No. 12; Dec. 2004; whole document (13 pages).

Morie, T. et al.; "A 71dB-SNDR 50MS/s 4.2mW CMOS SAR ADC by SNR Enhancement Techniques Utilizing Noise"; IEEE International Solid-State Circuits Conference Digest of Technical Papers (ISSCC); Feb. 17-21, 2013; whole document (3 pages).
Schreier, R. et al.; "Understanding Delta-Sigma Data Converters"; vol. 74; IEEE Press; 2005; whole document (455 pages).
Galton, I.; "Delta-Sigma Data Conversion in Wireless Transceivers"; IEEE Transactions on Microwave Theory and Techniques, vol. 50, No. 1; Jan. 2002; pp. 302-315.
Wu, C. et al.; "A Wideband 400 MHz-to-4 GHz Direct RF-to-Digital Multimode ΔΣ Receiver"; IEEE Journal of Solid-State Circuits, vol. 49, No. 7; Jul. 2014; pp. 1639-1652.
Martens, E. et al.; "RF-to-Baseband Digitization in 40 nm CMOS With RF Bandpass ΔΣ Modulator and Polyphase Decimation Filter"; IEEE Journal of Solid-State Circuits, vol. 47, No. 4; Apr. 2012; pp. 990-1002.
Verbruggen, B. et al.; "A 1.7 mW 11b 250 MS/s 2-Times Interleaved Fully Dynamic Pipelined SAR ADC in 40 nm Digital CMOS"; IEEE Journal of Solid-State Circuits, vol. 47, No. 12; Dec. 2012; pp. 2880-2887.
Rajaee, O. et al.; "Design of a 79 dB 80 MHz 8X-OSR Hybrid Delta-Sigma/Pipelined ADC"; IEEE Journal of Solid-State Circuits, vol. 45, No. 4; Apr. 2010; pp. 719-730.
Brooks, T. et al.; "A Cascaded Sigma-Delta Pipeline A/D Converter with 1.25 MHz Signal Bandwidth and 89 dB SNR"; IEEE Journal of Solid-State Circuits, vol. 32, No. 12; Dec. 1997; pp. 1896-1907.

* cited by examiner

*Primary Examiner* — Joseph Lauture
(74) *Attorney, Agent, or Firm* — Harrington & Smith

(57) ABSTRACT

An improved analog to digital converter comprises at least one delta sigma analog to digital converter stage and a succession of pipelined analog to digital converter stages. The pipelined analog to digital converter stages may have a sampling rate determined separately from that of the at least one delta-sigma analog to digital converter stage. The sampling rate of the at least one delta sigma analog to digital converter stage may be an oversampling rate. The sampling rate of the at least one delta-sigma analog to digital converter stages and the pipeline stages may be adjusted by adjusting their sampling frequency and the number of effective pipeline stages may be adjusted—for example, by adjusting a sampling frequency input at each stage. The effective number of pipeline stages may be adjusted, for example, based on the precision needed to process the current signal.

20 Claims, 2 Drawing Sheets

METHODS AND APPARATUS FOR AN IMPROVED ANALOG TO DIGITAL CONVERTER

TECHNICAL FIELD

The present invention relates generally to wireless communication. More particularly, the invention relates to transmitter and receiver design in wireless communication elements.

BACKGROUND

Analog to digital converters (ADCs) are an important element in modern radio receivers and are therefore important in modern wireless base stations and user devices. Modern devices frequently use large scale integration, with integrated circuits being fabricated so as to include numerous components. Space on an integrated circuit is at a premium in such designs, and power consumption is also an important consideration. As wireless communication standards continue to evolve, analog to digital converters are becoming more numerous because mechanisms such as carrier aggregation (CA) use multiple receiver paths and therefore multiple ADCs. Therefore, a smaller ADC footprint and lower ADC power consumption greatly simplify the design of receivers using multiple ADCs. In addition, current and anticipated communication mechanisms allow for the use of different modes and bands resulting in different specifications (such as variable bandwidth and variable blocking conditions). Improved ADC designs that can accommodate such considerations can provide significant advantages in accommodating the needs of the systems in which ADCs operate.

SUMMARY

In an embodiment of the invention, an analog to digital converter may comprises at least one delta-sigma analog to digital converter stage and a succession of pipelined analog to digital converter stages. The pipelined analog to digital converter stages exhibit a sampling rate determined separately from that of the at least one delta-sigma analog to digital converter stage.

In another embodiment of the invention, a method comprises processing a signal using an analog to digital converter, wherein the analog to digital converter comprises at least one delta-sigma analog to digital converter stage and a succession of pipelined analog to digital converter stages, and wherein the pipelined analog to digital converter stages exhibit a sampling rate determined separately from that of the at least one delta-sigma analog to digital converter stage.

In another embodiment of the invention, an apparatus comprises means for processing a signal using an analog to digital converter, wherein the analog to digital converter comprises at least one delta-sigma analog to digital converter stage and a succession of pipelined analog to digital converter stages, and wherein the pipelined analog to digital converter stages exhibit a sampling rate determined separately from that of the at least one delta-sigma analog to digital converter stage.

DETAILED DESCRIPTION

Figure 1:
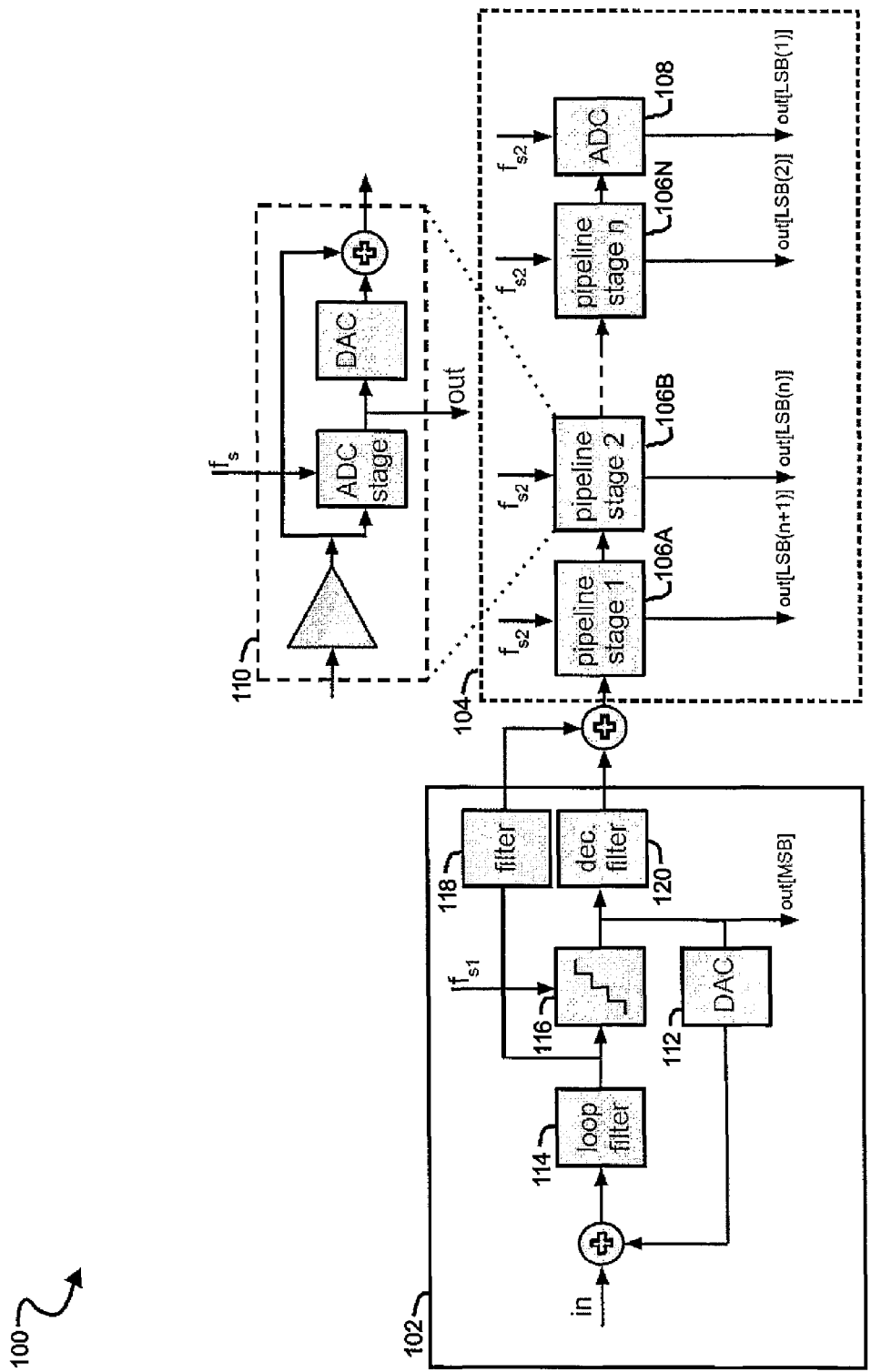
FIG. 1 illustrates an analog to digital converter according to an embodiment of the present invention.

Embodiments of the present invention address designs of ADCs for use in wireless communication transmitters and receivers (generally manifested in the form of transceivers), and use the benefits of Delta-Sigma ADCs (DS-ADC) with the benefits of the pipelined ADC principle to reduce the oversampling ratio (OSR) and order of the DS-ADC on one hand and the power consumption of the pipelined ADC on the other hand. Architectures according to one or more embodiments of the invention are flexible and allow for programmability to accommodate different modes. Optimal performance can be achieved for different modes by allowing for programmability, rather than requiring an ADC specifically designed for a worst-case situation and overdesigned for other cases.

Embodiments of the present invention provide for ADC designs that address particular challenges that have been introduced by current and developing wireless communication designs. Third generation partnership project long term evolution (3 GPP LTE) and 3 GPP LTE-advanced (LTE-A) signals are characterized by large blockers, both in-band and out-of band, that put significant constraints on LTE receivers. The blockers that are imposed may be up to 80 dB greater than the desired signal. The signal needs to be carefully filtered prior to the ADC in order to reduce the blockers below the noise floor and avoid aliasing effects. For blockers that are near in frequency to the desired signal, sufficient filtering is difficult to achieve, requiring power-hungry, high-order filters. Such signals are viewed as in-band signals for the ADC, imposing a number of difficulties relating to setting the sampling frequency and dynamic range (DR) requirements of the ADC:

- Nyquist samplers cannot be used and thus higher sampling frequencies need to be used. This leads to a higher power consumption in clock buffers, active elements, and similar components
- The DR of the ADC is much higher then the DR of the desired signal. This yields to a need for extra bits in the ADC and hence a higher power consumption.

DS-ADCs have features suggesting their use in such applications because they naturally use oversampling. This natural oversampling reduces the complexity and power consumption compared to pipelined-ADCs. Embodiments of the present invention, however, overcome drawbacks of DS-ADCs, including the need to guarantee the needed dynamic range through the use of either very high sampling frequencies (where clock generation, routing and buffering is tedious and power-hungry) or high-order filters (which are difficult to keep stable, especially for varying bandwidth (BW)).

In one or more embodiments, the invention implements a moderate DS-ADC (lower order, low/moderate oversampling ratio (OSR), low number of bits) as a first stage of a pipelined ADC. Such an approach benefits from the less stringent requirements related to the working principle of the DS-ADC (noise shaping effects of non-idealities). The required overall precision is obtained by adding extra pipeline stages to further quantize the quantization error of the DS-ADC and hence increase the effective number of bits (ENOB).

The complexity of the additional pipeline stages is reduced by reducing their sampling frequency. Furthermore, the number of additional pipeline stages can be programmed and optimized depending on the mode/blocker profile of the incoming signal.

Three major types of ADCs are available to transform the analog signal to the digital domain:

- Pipelined ADCs: Such ADCs can obtain good performance for large bandwidth signals and for this reason are frequently used in wireless systems because they can meet the performance requirements for large bandwidth signals. This capability comes, however at the cost high power consumption (and area) due to the high count of building blocks, such as amplifiers, comparators, and the like.

Successive Approximation Register (SAR) ADCs: Such ADCs exhibit a very good power consumption since they reuse the 1-bit quantizer and do the evaluation in multiple cycles. Their performance, however, is limited to an effective number of bits (ENOB) of 9 or 10 due to matching requirements. Furthermore, an internal clock frequency is needed which is much larger then the actual sampling frequency (e.g. for 10 bits DR, the internal frequency needs to be 10 times larger then the actual sampling frequency). This puts a restriction on the feasible BW for SAR ADCs DS-ADCs: Such ADCs use oversampling to reduce the complexity of the blocks for a certain DR. They are used, for example, in direct RF-to-digital recievers. Due to their extremely large OSR, they can theoretically achieve high DRs. This comes at the cost however of power-hungry clock generation and buffer circuits since phase noise at these frequencies kills the performance of the system. The advantages of such DS-ADCs are therefore higher for low- and medium frequency applications and low BW data communication.

When DS-ADCs are targeted for a certain bandwidth, there are three notable design freedoms:

Increasing the OSR and hence the sampling frequency. Phase noise and clock routing power becomes dominant when fs becomes too high.

Increasing the modulator order. This comes at the cost of decreased stability. This is extra problematic when programmability for different modes is targeted. This is usually solved through the use of multi-stage noise-shaping topologies (MASH)

Increasing the number of sampling bits. This also leads to higher complexity of the ADC and the DAC in the loop. Adding 1 bit to the ADC and the DAC doubles the complexity of these blocks.

One or more embodiments of the present invention combine the advantages of the oversampled DS-ADC (noise shaping effect, reduced complexity of building blocks, and similar advantages) with the advantages of pipelined ADCs (achieving high performance by dividing separate stages). The power consumption of the overall system is reduced by adjusting the sampling frequency for the consecutive stages. Furthermore, the performance of the overall system can be adjusted towards the different modes and bandwidth requirements in order to avoid overdesign in many modes.

In one or more embodiments, the invention may provide for:

Configuring an ADC to comprise a DS-ADC stage (or multiple stages) and regular consecutive pipelined stages.

Adjusting the sampling frequency of at least one of the DS-ADC stage or stages, which use oversampling, to a sampling frequency for the successive pipeline stages that is determined separately from that of the one or more DS-ADC stages. For example, a lower bandwidth may be chosen, in order to reduce bandwidth and, thus, power consumption.

Programming the ADC so as to achieve a desired number of pipeline stages, with the programming being directed to providing for a required effective number of bits (ENOB). For example, if no blockers are present, the DS-ADC alone may be sufficient, without a need for additional pipeline stages. If large (in-band) blockers are present, a greater ENOB is needed, so that additional stages may be switched in.

Such programmability may allow for adaptation to the specific requirements of each mode/carrier frequency and may allow for power consumption directed to the needs of the individual case, rather than a power consumption that in many cases exceeds what is needed.

DS-ADCs have three parameters that can be used to obtain a desired precision: oversampling ratio, number of quantization bits (B) and filter order (n). The influence of these parameters on the peak signal-to-quantization noise ratio (SQNR) is given by the following equation:

$$SQNR = \frac{3\pi}{2}(2^B - 1)^2(2n+1)\left(\frac{OSR}{\pi}\right)^{2n+1} \quad (1)$$

For high-bandwidth signals such as those required for LTE and other existing or future high volume data communication mechanisms, either high order filters (which are complex to implement and keep stable), large OSRs (with complex and power-hungry clock generation, buffering and routing) or high quantization bits (with worse linearity in the feedback DAC) are needed. This is difficult to achieve and therefore, pipelined ADCs have typically been used for these applications. The pipelined ADC approach splits the conversion into consecutive conversion stages, each requiring reduced precision. At each stage, the quantization error of the stage is measured (typically by a flash ADC), amplified and fed to the following stage.

Due to the existence of in-band blockers, which cannot be fully filtered out, nyquist ADCs cannot be used and higher sampling frequencies are needed. Therefore, the (pipelined) ADC needs to run at higher sampling frequencies.

Embodiments of the present invention may have the advantage that oversampling is needed for pipelined ADCs, and embodiments of the invention may thus use an ADC stage that naturally oversamples. Thus, rather than using a conventional initial stage of a pipelined ADC, embodiments of the invention may use an initial DS-ADC. This DS-ADC may be able not only to be implemented with lower complexity than in an implementation in which only a single DS-ADC stage is used as the complete ADC, but also with lower complexity than a conventional first stage of a pipelined ADC.

FIG. 1 illustrates an analog to digital converter (ADC) 100 according to one or more embodiments of the present invention. The ADC 100 comprises a first DS-ADC stage 102, with sampling frequency $f_{s1}$, generating the most significant bits (MSBs) connected to a pipelined analog to digital converter module 104 comprising and a plurality of successive pipeline stages 106A, 106B, . . . , 106N, followed by an ADC 108. Each of the pipeline stages 106A, 106B, . . . , 106N may comprise a sub-ADC, an MDAC and a residual amplifier (the stage 106B being expanded to illustrate the sub-ADC, MDAC and the residual amplifier 110). The DS-ADC stage 102 comprises a DAC 112, whose output is subtracted from the input, and this difference is filtered using a loop filter 114 and supplied to a quantizer 116. The output of the DAC 110 of the first stage 102 is compared to the output of its quantizer 114 (in the loop). These two signals are filtered first, using an analog quantizer filter 118 and a digital filter 120, producing a quantization error that is further quantized by the successive pipeline stages, which have a sampling frequency $f_{s2}$.

The analog quantizer filter 118 can be implemented in any number of ways, such as through a passive filter, an RC-filter, an analog FIR filter, or any other appropriate filter mechanism. The complexity of the DS-ADC stage is limited because not all the bits need to be provided by this stage, thus making for a low oversampling ratio and relatively small number of bits. Therefore, the complexity of the digital filter for the output can also be relatively low.

As with every pipelined ADC, a tradeoff between the number of bits per stage and number of stages can be made. Embodiments of the present invention allow full range to this design freedom.

The precision required of the ADC may differ depending on the incoming signal (for example, mode, bandwidth, blocker profile, and other characteristics). Embodiments of the present invention allow for programmability to accommodate the actual precision required for a particular case. An ADC such as the ADC 100 of FIG. 1 may be achieved by one or more of adjusting the sampling frequencies fs1 and fs2 of the DS-stage and the pipeline stages, and switching different pipeline stages in or out. For some cases, the DS-ADC stage alone can be sufficient while for other cases, extra DR is needed (such as in cases in which blockers are present, digital gain control is needed, or other conditions are present calling for additional DR. Dynamically switching one or more extra pipeline stages in or out, gives an optimal DR for the specific situation, rather than requiring a design with the maximum number of stages, and providing the maximum precision, that will be required in any case.

Figure 2:
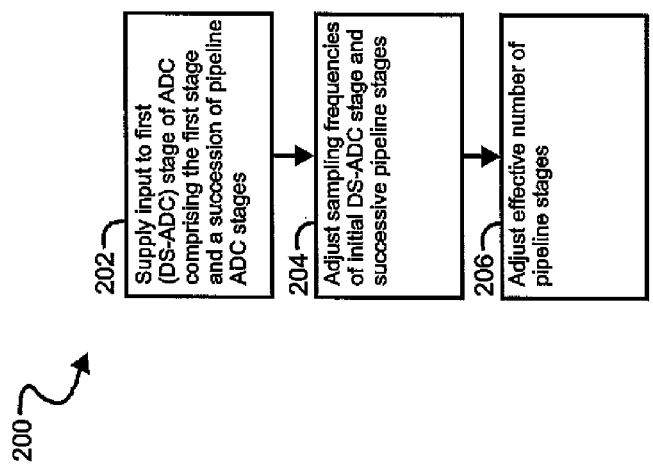
FIG. 2 illustrates a process according to an embodiment of the present invention.

FIG. 2 illustrates a process 200 according to an embodiment of the present invention. At block 202, an input is supplied to a first stage of an ADC comprising a first DS-ADC stage and a succession of pipeline ADC stages. At block 204, the sampling frequencies of the initial DS-ADC stage and the successive pipelined stages are adjusted through the use of frequency sampling inputs, with the DS-ADC stage being adjusted to a higher, oversampling frequency, and the pipeline stages being adjusted to lower frequencies. At block 206, the number of pipeline stages in use is modified based on the precision required, with the required precision being, for example, specified in terms of effective number of bits.

While various exemplary embodiments have been described above it should be appreciated that the practice of the invention is not limited to the exemplary embodiments shown and discussed here. Various modifications and adaptations to the foregoing exemplary embodiments of this invention may become apparent to those skilled in the relevant arts in view of the foregoing description.

Further, some of the various features of the above non-limiting embodiments may be used to advantage without the corresponding use of other described features.

The foregoing description should therefore be considered as merely illustrative of the principles, teachings and exemplary embodiments of this invention, and not in limitation thereof.

I claim:

1. An analog to digital converter comprising:
   at least one delta-sigma analog to digital converter stage;
   a succession of pipelined analog to digital converter stages;
   wherein the pipelined analog to digital converter stages exhibit a sampling rate determined separately from that of the at least one delta-sigma analog to digital converter stage.

2. The analog to digital converter of claim 1, wherein the sampling rates of the at least one delta-sigma analog to digital converter stage and the pipelined analog to digital converter stages are adjustable.

3. The analog to digital converter of claim 2, wherein the sampling rate of each stage is adjusted by adjusting a sampling frequency of the stage.

4. The analog to digital converter of claim 1, wherein the number of pipelined analog to digital converter stages is programmable.

5. The analog to digital converter of claim 4, wherein the number of pipelined analog to digital converter stages is programmable based on the precision required to process the current signal.

6. The analog to digital converter of claim 1, wherein the pipelined analog to digital converter stages exhibit a lower sampling rate than does the at least one delta-sigma analog to digital converter stage.

7. The analog to digital converter of claim 1, wherein the at least one delta-sigma analog to digital converter stage is a single stage.

8. The analog to digital converter of claim 7, wherein the single delta-sigma analog to digital converter stage is an initial stage.

9. A method comprising:
   processing a signal using an analog to digital converter, wherein the analog to digital converter comprises at least one delta-sigma analog to digital converter stage and a succession of pipelined analog to digital converter stages, wherein the pipelined analog to digital converter stages exhibit a sampling rate determined separately from that of the at least one delta-sigma analog to digital converter stage.

10. The method of claim 9, wherein the sampling rates of the at least one delta-sigma analog to digital converter stage and the pipelined analog to digital converter stages are adjustable.

11. The method of claim 10, wherein the sampling rate of each stage is adjusted by adjusting a sampling frequency of the stage.

12. The method of claim 9, wherein the number of pipelined analog to digital converter stages is programmable.

13. The method of claim 9, wherein the number of pipelined analog to digital converter stages is programmable based on the precision required to process the current signal.

14. The method of claim 9, wherein the pipelined analog to digital converter stages exhibit a lower sampling rate than does the at least one delta-sigma analog to digital converter stage.

15. The method of claim 9, wherein the at least one delta-sigma analog to digital converter stage is a single stage.

16. The method of claim 15, wherein the single delta-sigma analog to digital converter stage is an initial stage.

17. An apparatus comprising:
   means for processing a signal using an analog to digital converter, wherein the analog to digital converter comprises at least one delta-sigma analog to digital converter stage and a succession of pipelined analog to digital converter stages, wherein the pipelined analog to digital converter stages exhibit a sampling rate determined separately from that of the at least one delta-sigma analog to digital converter stage.

18. The apparatus of claim 17, wherein the analog to digital converter comprises means for adjusting the sampling rates of the at least one delta-sigma analog to digital converter stage and the pipelined analog to digital converter stages.

19. The apparatus of claim 18, wherein the means for adjusting the sampling rate of each stage comprises means for adjusting a sampling frequency of the stage.

20. The apparatus of claim 17, wherein the analog to digital converter comprises means for programming the number of pipelined analog to digital converter stages.

\* \* \* \* \*